(12) United States Patent
Camp, Jr. et al.

(10) Patent No.: US 6,359,506 B1
(45) Date of Patent: Mar. 19, 2002

(54) LINEAR MODULATION USING A LINEAR AND A NON-LINEAR AMPLIFIER

(75) Inventors: William O. Camp, Jr., Chapel Hill; Paul W. Dent, Pittsboro, both of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/710,537

(22) Filed: Nov. 9, 2000

Related U.S. Application Data

(63) Continuation-in-part of application No. 09/054,063, filed on Apr. 4, 1998, now Pat. No. 6,133,788.

(51) Int. Cl.[7] .............................................. H03F 3/68
(52) U.S. Cl. .................. 330/124 R; 330/295; 330/129; 332/149; 455/108
(58) Field of Search ........................ 330/124 R, 295, 330/129; 332/149, 103, 144; 455/108, 111; 375/268, 269

(56) References Cited

U.S. PATENT DOCUMENTS

| | | | | |
|---|---|---|---|---|
| 4,701,716 A | * | 10/1987 | Poole | 330/43 |
| 4,965,527 A | * | 10/1990 | Clark et al. | 330/124 R |
| 5,015,965 A | * | 5/1991 | Katz et al. | 330/149 |
| 5,438,684 A | * | 8/1995 | Schwent et al. | 455/89 |
| 5,568,086 A | * | 10/1996 | Schuss et al. | 330/124 R |
| 6,262,629 B1 | * | 7/2001 | Stengel et al. | 330/124 R |

* cited by examiner

Primary Examiner—Robert Pascal
Assistant Examiner—Henry Choe
(74) Attorney, Agent, or Firm—Coats & Bennett, P.L.L.C.

(57) ABSTRACT

A power amplifier uses a modulation technique that varies amplitude of a drive signal and, optionally, phase angle of the drive signal. The power amplifier comprises two coupled amplifiers, a first one of which is operated saturated to produce a constant voltage output. The first amplifier is coupled to a second one of the amplifiers via a quarter wave transmission line. The second amplifier is operated in a linear mode to deliver an output signal controlled by an amplitude-modulating signal. The amplitude-modulating signal may be a bipolar modulation signal that produces both positive and negative outputs from the second amplifier that add to or subtract from the output from the first amplifier to develop at a load impedance net output signal amplitudes varying between a minimum or "trough" amplitude and a maximum or "crest" amplitude. The coupling of the first and second amplifiers through a quarter-wave line allows the signal current of the second amplifier to modulate the effective load impedance seen by the first amplifier to provide efficient amplifier coupling.

71 Claims, 3 Drawing Sheets

LINEAR MODULATION USING A LINEAR AND A NON-LINEAR AMPLIFIER

CROSS REFERENCE

This is a continuation-in-part of application Ser. No. 09/054,063, filed Apr. 4, 1998, now U.S. Pat. No. 6,133,788 entitled "Hybrid Chireix/Doherty Amplifiers and Methods", assigned to the assignee of the present invention.

BACKGROUND OF THE INVENTION

The present invention relates to an amplifier of improved efficiency, and in particular to such an amplifier that may be used in radio transmitters for transmitting signals of varying amplitude.

In wireless communications systems, it is desirable for radio frequency (RF) power amplifiers to linearly amplify RF signals in a highly efficient manner. The high efficiency amplifier has particular applicability for use in the transmitter circuit of an RF communications device such as a two-way radio, cellular telephone, cordless telephone, base station equipment, radio repeater, and the like. However, there are tradeoffs between maximum efficiency and high linearity. Efficiency is generally proportional to input drive level, and high efficiency is usually not attained until an amplifier approaches its maximum output power, which is not consistent with linear operation. Doherty-type amplifiers achieve an efficiency advantage over standard Class AB and Class B amplifiers near peak power, in part because of an instantaneous modulation of their carrier amplifier's loadline as the RF input level changes. In other words, Doherty-type amplifiers exhibit a more benign relationship between input drive level and efficiency, because the amplifier's loadline is continuously modified to maintain high efficiency as input drive levels change. In addition, the bias power of Doherty-type amplifiers is greatly reduced over standard Class AB and Class B amplifiers In a prior art Doherty amplifier, two linear amplifiers are coupled at their outputs with a quarter wave line and both are driven with a varying amplitude drive signal. The first amplifier develops an output current proportional to the drive signal up to a certain saturation point. The second amplifier is back-biased so that it does not contribute an output current until the drive signal approaches the saturation point of the first amplifier. At and beyond the point where the drive signal reaches the saturation point of the first amplifier, the second amplifier contributes an output signal current and simultaneously reduces the effective load impedance seen by the first amplifier, so that the first amplifier can then generate a higher saturated output power.

In the Doherty amplifier, the second amplifier is never driven in the reverse phase to subtract from the net output signal in order to increase the effective load impedance seen by the first amplifier, thereby reducing the saturated output power of the first amplifier. Also, the RF input signal to the Doherty amplifier is applied to the first and second amplifiers through a quadrature splitter. The arrangement is such that an in-phase (0°) output from the quadrature splitter is applied to the first amplifier while a quadrature phase (−90°) output is applied to the second amplifier.

In U.S. patent application Ser. No. 09/054,063, filed Apr. 4, 1998, entitled "Hybrid Chireix/Doherty Amplifiers and Methods" and assigned to the assignee of the present invention, it is taught that the most advantageous way to construct a Doherty amplifier in modern technology is to use a digital signal processor to generate two (I, Q) quadrature modulating waveforms with two separate quadrature modulators in order to form the two out of phase amplifier drive signals. It also is taught that efficient linear amplification may be performed using two constant amplitude amplifiers as compared to two linear amplifiers as are used in a Doherty amplifier. Said U.S. patent application Ser. No. 09/054,063 is specifically incorporated herein by reference.

SUMMARY OF THE INVENTION

In accordance with the present invention, there is provided a power amplifier that may be used to transmit modulated radio frequency carrier signals. The power amplifier uses a modulation technique that varies the amplitude of a drive signal and, optionally, the phase of the drive signal. The power amplifier comprises two coupled amplifiers, each contributing a fraction of a desired total maximum power. A first one of the amplifiers is operated saturated, so that it produces a constant voltage output, and is coupled to a second one of the amplifiers via a quarter wave transmission line or the equivalent thereof. A second one of the amplifiers is operated in a linear mode to deliver an output signal current that is controlled by an amplitude-modulating signal. The amplitude-modulating signal may be a bipolar modulation signal capable of producing both positive amplitudes and negative (i.e. phase-inverted) amplitudes of the drive signal. The drive signal is input to both amplifiers and is phase modulated with the phase angle part of the desired modulation. The bipolar amplitude-modulating signal causes the second amplifier's output signal to either add to, in the case of positive amplitudes, or subtract from, in the case of negative amplitudes, an output from the first amplifier, thus creating net output signal amplitudes varying between a minimum or "trough" amplitude and a maximum or "crest" amplitude. The coupling of the first and second amplifiers through a quarter wave line allows the signal current of the second amplifier to modulate the effective load impedance seen by the first amplifier, as in the Doherty amplifier, to thereby provide efficient amplifier coupling.

DETAILED DESCRIPTION OF THE INVENTION

Figure 1:
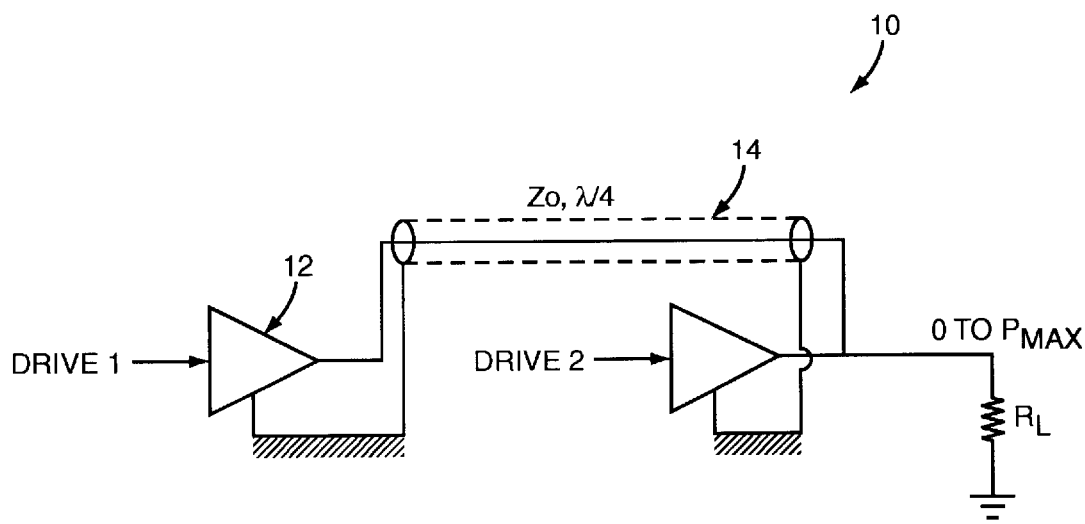
FIG. 1 shows a prior art Doherty amplifier.

FIG. 1 shows a prior art Doherty amplifier 10, which typically has a fixed supply or drain voltage and operates at maximum efficiency when the voltage of the output signal is equal to the supply voltage. Saturation occurs at 0 dB backoff, and Doherty amplifier efficiency, which is defined as the ratio of radio frequency (RF) power output to input power, drops slightly with increasing backoff from saturation, until a transition voltage is reached at 6 dB from saturation. At a 6 dB backoff from saturation, maximum Doherty amplifier efficiency is again reached. Below the transition voltage, efficiency falls off rapidly with increasing backoff from saturation. As is known, as the power of a Doherty amplifier output signal decreases, the efficiency is reduced proportionally to the output signal voltage amplitude. Therefore, when the Doherty amplifier output signal is low, efficiency is low. Conversely, when the Doherty amplifier output signal is high, efficiency is high.

In the Doherty amplifier 10 of FIG. 1, a first amplifier 12 is driven with a signal Drive 1 to generate an amplified output that is applied through a quarter wave line 14 ($Z_o$, $\lambda/4$) to a load impedance $R_L$ to develop at the load up to one quarter the peak power of the Doherty amplifier, i.e. $P_{max}/4$. When the first amplifier 12 approaches saturation, i.e. when its output voltage swing approaches the supply voltage and cannot increase further, a second or "boost" amplifier 16 is driven with a signal Drive 2. The second amplifier 16 then contributes to the output current of the Doherty amplifier into the load impedance $R_L$ and causes the output power to rise beyond $P_{max}/4$. Due to the reciprocal impedance property of a quarter wave line, when the second amplifier 16 takes on some of the load of supplying output power, it does not relieve the first amplifier 12 of the need to supply as much output power, but instead loads the first amplifier 12 more heavily. This allows the first amplifier 12 to supply more output current to the load impedance, even though its output voltage swing cannot increase above the level of the supply voltage. The result is that the first amplifier's output power at the load impedance increases from $P_{max}/4$ to $P_{max}/2$, while the second amplifier's output power at the load impedance increases to $P_{max}/2$, so that the respective first and second amplifiers 12 and 16 jointly achieve, at the load impedance, the desired peak output power $P_{max}$. The Doherty amplifier achieves maximum Class-B efficiency (theoretically 78.5%) at output powers of $P_{max}/4$ and Pmax, is relatively flat in between, and has a substantially constant high efficiency over the range from 6 dB of output backoff up to saturation. In the Doherty amplifier 10 of FIG. 1, both the first and second amplifiers 12 and 16 must have a linear region of operation, and two drive signals of modulated amplitude are required, which two drive signals may be derived from a single RF input signal via a splitter. Furthermore, the second drive signal that is applied as an input to the second amplifier 16 must commence to rise above zero amplitude, or above a reverse bias point, just at the point where the first drive signal has driven the first amplifier 12 to saturation. This is necessary in order to "dovetail" the contributions of the two amplifiers to one another, thereby maintaining an overall linear curve of output versus input. Various factors, such as load impedance mismatch, can disturb this dovetailing and cause distortion.

Figure 2:
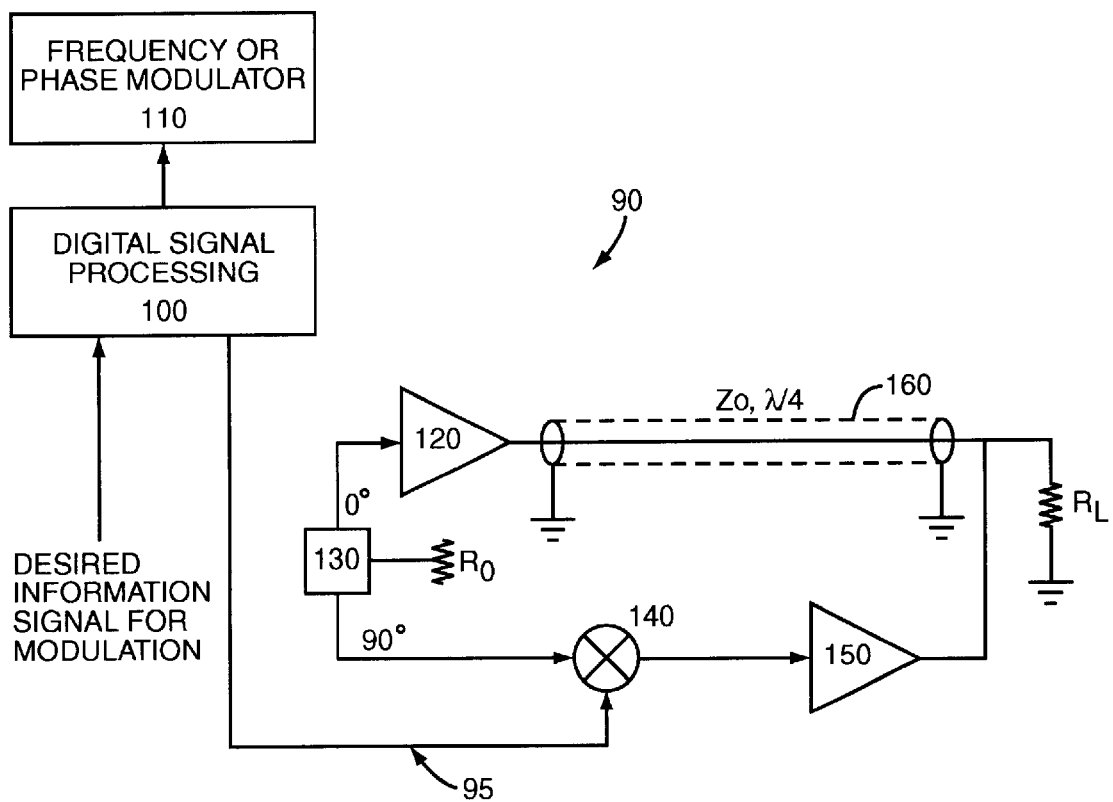
FIG. 2 illustrates an amplifier embodying the teachings of the present invention.

FIG. 2 illustrates an implementation of an amplifier circuit 90 according to the teachings of the present invention, which may be used, for example, in a radio transmitter for efficiently generating transmission signals of varying amplitude. The amplifier circuit 90 has particular applicability for use in the transmitter circuit of an RF communications device such as a two-way radio, mobile telephone, cordless telephone, base station equipment, radio repeater, and the like.

As used herein, the term "mobile terminal" may include a mobile communications radiotelephone with or without a multi-line display; a Personal Communications System (PCS) terminal that may combine a mobile communications radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Mobile terminals may also be referred to as "pervasive computing" devices.

The amplifier circuit 90 includes an amplifier driver circuit 95 for driving a first amplifier 120 and a second amplifier 150. The amplifier driver circuit 95 includes a digital signal processor (DSP) 100 that receives a desired information signal and generates, based upon the information signal, signals corresponding to desired frequency or phase modulation, collectively known as angle modulation, and signals corresponding to desired bipolar amplitude modulation. The angle modulation signal from the DSP 100 is applied to a frequency/phase modulator 110, also called an angle modulator, such as a modulatable fractional—N frequency synthesizer. The angle modulator 110 produces, in accordance with the angle modulation signal, a constant amplitude radio frequency (RF) output signal, i.e., a signal that may be defined by a constant length rotating vector that follows a desired phase angle trajectory and/or exhibits a desired phase shift. When the angle modulator 110 is to operate as a frequency modulator, the DSP 100 calculates and inputs to the angle modulator 110 output frequency samples representing the phase slope, i.e., the instantaneous frequency, necessary to cause the phase angle of the angle modulator 110 RF output signal to move from a current value and pass through the next desired value in a manner achieving linear interpolation. The constant amplitude RF output signal from the angle modulator 110 is input to and split in a 90° splitter 130 to produce a drive signal for input to the first amplifier 120, which comprises a saturated power amplifier, and a 90° delayed signal for input to a balanced amplitude modulator 140. The 90° delayed signal input to the balanced modulator 140 compensates for a 90° phase shift introduced by a quarter wave circuit, which may be a quarter wave transmission line 160 ($Z_o$, $\lambda/4$) as shown, at the output of the first amplifier 120. The splitter 130 can be a quadrature splitter to split the output of the angle modulator 110. The splitter 130 may also be, for example, a directional coupler or a 90° hybrid having an input port, two output ports and an "isolated" port that is terminated in characteristic impedance $R_o$, as shown. Such a splitter preferably provides isolation between its two outputs, such that non-linear distortion produced at the input of the first amplifier 120 is prevented from reaching the balanced amplitude modulator 140. It is understood that instead of the splitter 130, any other method of obtaining two outputs from the phase modulator 110 with a 90° relative phasing may be used.

The balanced amplitude modulator 140, which may be a Gilbert Cell balanced modulator, effectively multiplies the angle-modulated output signal from the angle modulator 110, as phase shifted by the 90° splitter 130, by a bipolar amplitude-modulating signal that is output from the DSP 100 and represents both positive and negative scaling factors. The output of the balanced modulator 140 provides a varying amplitude drive signal to the second amplifier 150, which comprises a linear non-saturated power amplifier. This drive signal follows the same phase modulation as the drive signal to the saturated power amplifier 120, except for a constant 90° phase lag provided by the splitter 130 to compensate for the lag introduced by the quarter wave line ($Z_o$, $\lambda/4$) on the output of the first amplifier 120, and except for a possible phase inversion of the drive signal in the balanced modulator 140 when the bipolar amplitude modulation signal from the DSP 100 goes negative. Thus, for positive amplitude modulation, the amplified output of the linear amplifier 150 is in phase with the output of the saturated power amplifier 120 after the quarter-wave line, while for negative amplitude modulation it is out of phase. Therefore, the output of the linear amplifier 150 may be made to add to or subtract from the output of the saturated power amplifier 120, in order to vary the net amplitude of an RF output signal applied to a load $R_L$.

In an exemplary application, a desired information signal to be amplified to a transmit power level at the load impedance $R_L$ has an amplitude variation from 0.2 of the mean amplitude (14 dB below the mean) to 1.6 times the mean amplitude (4 dB above the mean). The amplitude midway between the trough of 0.2 of the mean and the crest of 1.6 of the mean is 0.9 of the mean. Therefore, for this application the saturated power amplifier 120 is caused to deliver 0.9 of the mean amplitude to the load $R_L$ when the non-saturated linear amplifier 150 is contributing zero, and the linear amplifier 150 contributes up to +0.7 of the mean amplitude on the crests or subtracts 0.7 of the mean amplitude on the troughs. It is understood that the saturated power amplifier 120 operates in such manner that increases in the peak-to-peak amplitude of the RF signal at its input from the angle modulator 110, beyond a certain amplitude, do not cause further increases in the peak-to-peak amplitude of the RF signal at the output of the amplifier.

If both of the amplifiers 120 and 150 operate from the same supply voltage Vcc, and assuming a push-pull configuration, then the amplifiers can deliver an output voltage swing of +/−Vcc across the load $R_L$. The impedance $Z_o$ of the quarter-wave line 160 is then given by $Z_o=(1.6/0.9)\times R_L$, in order that the saturated output voltage swing of the amplifier 120 across the load be only 0.9/1.6 times the peak voltage swing across the load, i.e., $(0.9/1.6)\times 2$ Vcc, when the linear amplifier 150 is assisting to the maximum. The mean current consumed by the first amplifier 120 when delivering its saturated output to the load with no assistance from the amplifier 150 is then $(0.9/1.6)^2\times(2/\pi)\times Vcc/R_L$, at which point the DC to RF conversion efficiency is the theoretical class-B efficiency of $\pi/4$ or 78.5%. The efficiency is also 78.5% when the amplifier 150 is contributing its maximum output. The efficiency versus output curve "A" has been computed and is compared with a conventional class-B curve "B" in FIG. 3. It is seen that a substantial enhancement to the efficiency of the amplifier circuit of the invention occurs in and around the mean amplitude of the hypothesized modulation, which is the region in which the signal is most likely to lie.

The amplifier of the invention can be optimized for other modulations with other peak to mean and trough to mean ratios by suitable choice of the quarter wave line impedance $Z_o$, i.e., $Z_o=V_{peak}/V_{mean}\times R_L$, such that the amplifier 120 delivers a signal amplitude to the load $R_L$, between the peak and trough amplitudes, characteristic of the angle modulation, and also such that the second amplifier 150 is driven to add or subtract from that amplitude in order to create the peaks and the troughs. These values can be chosen for maximum mean efficiency, which is defined as the mean power output divided by the mean current consumption of both of the amplifiers 120 and 150 summed, times the supply voltage Vcc. The mean output power may be computed from the modulation characteristics alone, as it is independent of the amplifier design. The mean current consumption may be computed from the mean of the sum of the supply currents of the amplifiers 120 and 150 over a sufficiently long sample of the modulation waveform. The supply current for the first amplifier 120 is proportional to the instantaneous signal amplitude output to the load, divided by the quarter-wave line impedance $Z_o$. The supply current for the second amplifier 150 is instantaneously proportional to the modulus of the bipolar amplitude modulation signal.

The amplifier of the invention uses drive waveforms that are simpler to generate than those for the Doherty amplifier. The drive waveform output by the angle modulator 110 for the saturated power amplifier 120 is of constant amplitude, while a bipolar amplitude modulation waveform A1(t) for the balanced amplitude modulator 140 is linearly related to a desired modulation A(t) by the equation $A1(t)=A(t)-A_o$, where A(t) is the amplitude of the desired RF signal at the impedance load $R_L$, A1(t) is the output amplitude contribution from the second amplifier 150, and $A_o$ is the output amplitude when the first amplifier 120 alone is conducting and contributing current to the load $R_L$. $A_o$ can be chosen to be midway between the desired peak and trough amplitudes, as used in the above example, but does not need to be so, as the amplitude contribution A1(t) from the second amplifier 150 does not have to swing symmetrically positive and negative. The maximum positive contribution from the second amplifier 150 should, however, correspond to the second amplifier maximum efficiency, i.e. when the second amplifier 150 is operating near saturation. Since the maximum negative contribution from the second amplifier 150 then has to be lower in absolute magnitude than the amplitude $A_o$ of the saturated output contribution of the first amplifier 120, this implies that the contribution $A_o$ from the first amplifier 120 alone must be equal to or lower than midway between peak and trough amplitudes. For example, the first amplifier 120 could be set to contribute a value of 0.8 times the mean amplitude instead of the 0.9 times the mean amplitude used above, in which case the second amplifier 150 would then modulate up to a positive contribution of +0.8 times the mean amplitude and down to a negative contribution of −0.6 times the mean amplitude. By computing the mean efficiency as defined above for the actual statistical amplitude distribution characteristic of the modulation, a design center giving maximum mean efficiency can be found.

Other methods of generating the drive waveforms can be used. For example, any desired modulation can be expressed in terms of an I-waveform and a Q-waveform, as is well known in the art. The I-waveform modulates a cosine carrier component and the Q-waveform modulates a sine carrier component.

A constant-amplitude modulation, having the same phase angle as (I, Q), may be obtained by dividing (I, Q) by its own length, obtaining:

$$(I_o, Q_o) = \frac{(I, Q)}{\sqrt{I^2 + Q^2}}$$

Figure 4:
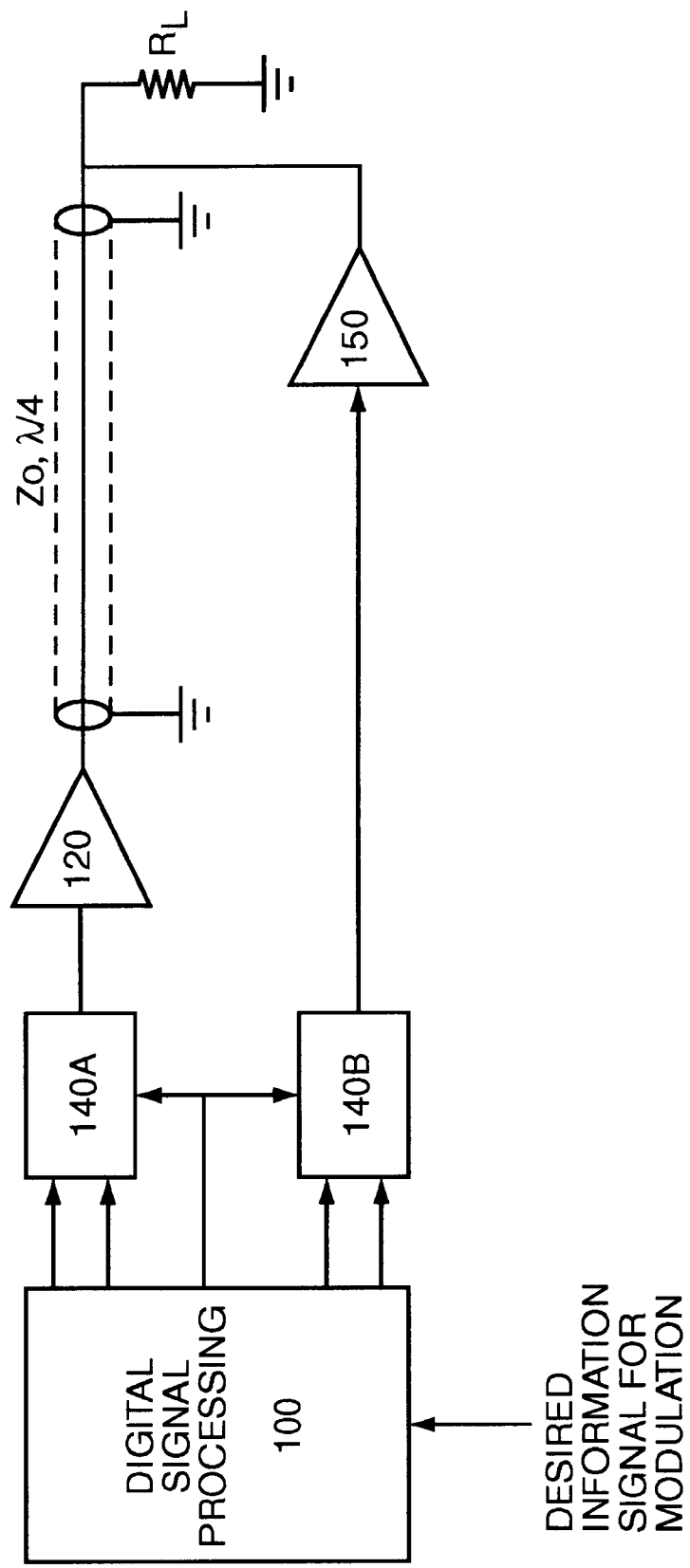
FIG. 4 illustrates an amplifier according to an alternative embodiment of the invention.
Figure 1:
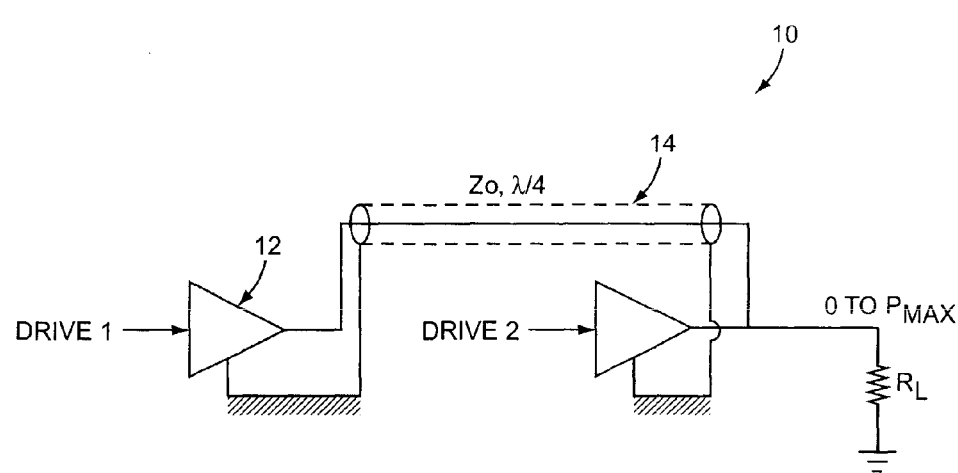
Figure 2:
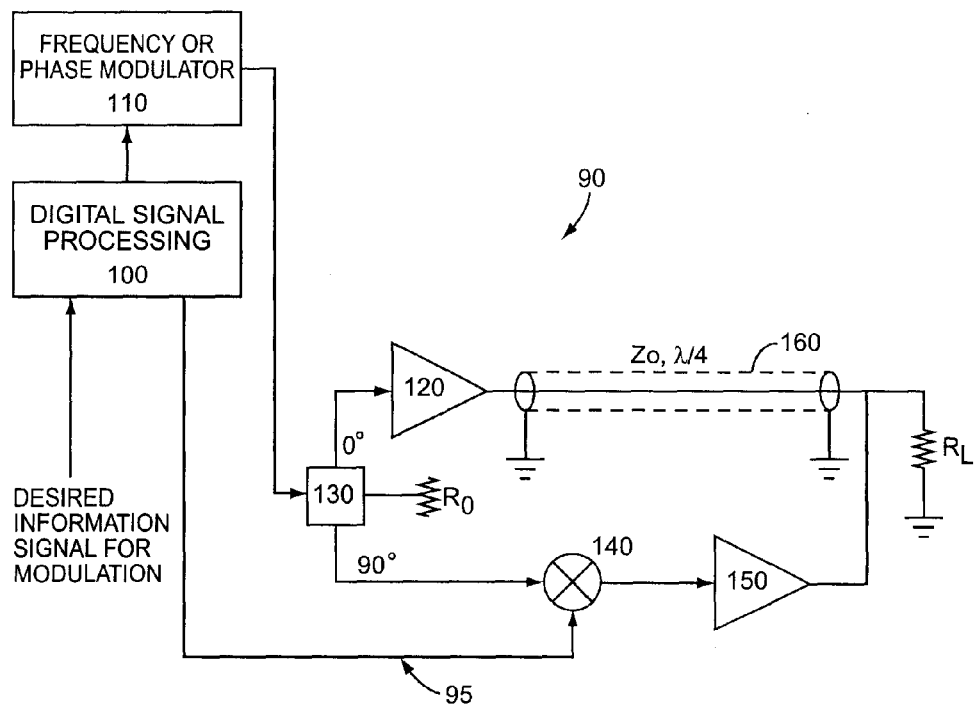
Figure 3:
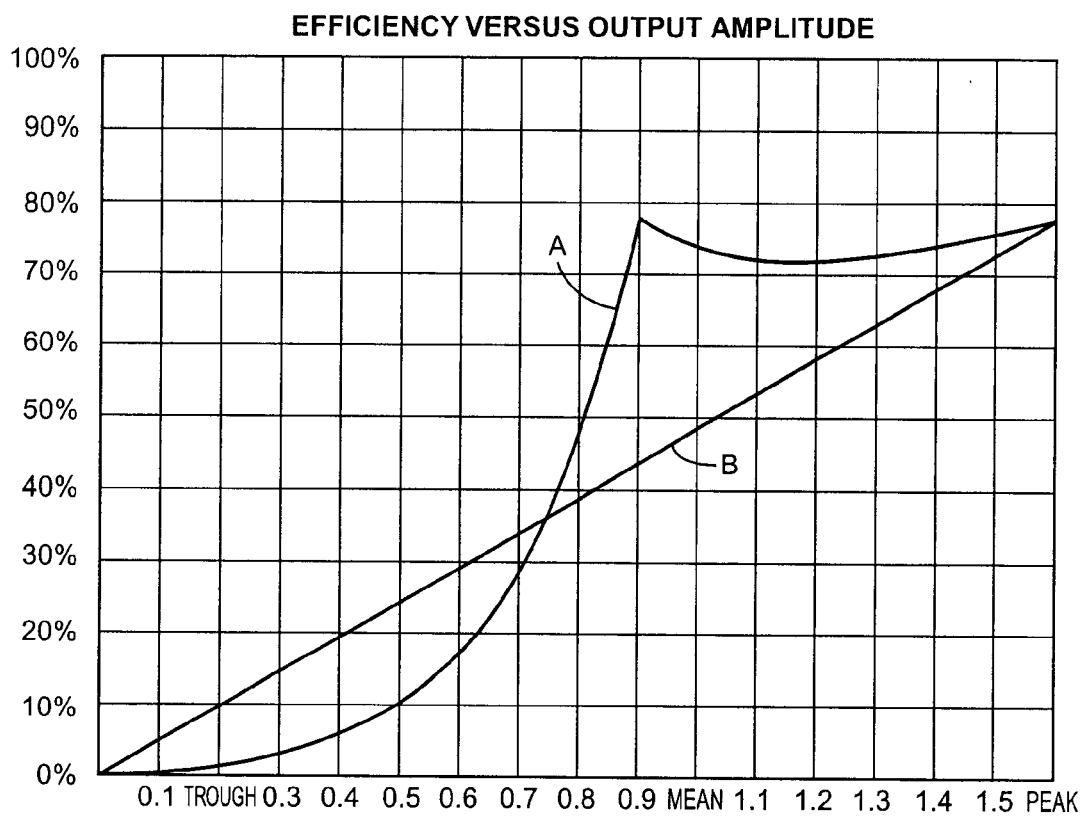

Assuming the (I, Q) modulation values are scaled so that the mean amplitude is unity, the peak amplitude is $A_{max}$ and the trough amplitude is $A_{min}$, then the modulation signal for the amplifier 150 may be calculated from:

$$(I_1, Q_1)=(I, Q)-a(I_o, Q_o)$$

where, for example, the factor "a" equals $(A_{max}+A_{min})/2$, or equals a lower value. Using a value for "a" less than $(A_{max}+A_{min})/2$ will make the amplifier 150 contribute more on positive peaks than it subtracts on troughs, and the two places where the overall amplifier achieves maximum Class-B efficiency will move apart. Maximum efficiency will then be achieved at an amplitude output level of "a", when the second amplifier 150 is non-conducting and contributing nothing, rather than at $(A_{max}+A_{min})/2$, and at $A_{max}$, where the second amplifier 150 also is in saturation. Under this circumstance, $a(I_o, Q_o)$ is then the modulation for the first amplifier 120, and can be applied by using a quadrature modulator 140A as in FIG. 4. The scaling by the factor "a" may be dropped, as the first amplifier 120 is saturated. The correct scaling of the relative contributions of amplifiers 120 and 150 is determined by the choice of the quarter wave line impedance Zo, and by a correct gain setting of the amplitude modulator 140 and the linear amplifier 150. Alternatively the drive signal for amplifier 150 may be created using a quadrature modulator 140B as in FIG. 4. The two quadrature modulators 140A, 140B may easily be arranged to output the desired relatively 90° phase shifted signals by swapping ($I_1$, $Q_1$) for ($Q-I_1$) internally.

The amplifier can be used to amplify, to a transmit power level, all manner of drive signal modulations that vary in amplitude and, optionally, phase, such as analog single-sideband modulation (SSB voice) or digital modulations such as 16 QAM, linear 8-PSK and the like. The design of a digital signal processor 100 to generate the required angle modulation and bipolar amplitude modulation signals is within the capabilities of a person skilled in the art, and may be of a design as disclosed in said application Ser. No. 09/054,063.

While embodiments of the invention have been described in detail, various modifications and other embodiments thereof may be devised by one skilled in the art without departing form the spirit and scope of the invention, as defined in the appended claims.

We claim:

1. A circuit for producing at a load impedance an amplified radio frequency (RF) signal having a desired varying amplitude with improved mean efficiency of conversion of DC input power to said circuit to output signal power at said load impedance, comprising:

a first amplifier operating in a saturated mode with constant output voltage amplitude and connected at its output through a quarter wave network to the load impedance; and a second amplifier connected at its output to said load impedance, said second amplifier being driven to generate a modulated signal amplitude output that adds to and substracts from signal amplitude at said load impedance due to said first amplifier to produce at said load impedance the amplified RF signal.

2. A circuit as in claim 1, wherein said second amplifier is driven in accordance with the value of the RF signal.

3. A circuit as in claim 1, wherein said quarter wave network comprises a quarter wave transmission line having an electrical length of one quarter the wavelength of the RF signal.

4. A circuit as in claim 1, further comprising:

a radio frequency (RF) signal generator for generating an RF signal having a desired angle modulation; and a 90° splitter for splitting the generated RF signal into first and second phase modulated signals having a constant relative phase difference of 90°, said first signal being connected to an input of said first amplifier and said second signal being coupled to an input of said second amplifier.

5. A circuit as in claim 4, in which said RF signal generator generates an RF signal having a desired frequency modulation.

6. A circuit as in claim 4, in which said RF signal generator generates an RF signal having a desired phase modulation.

7. A circuit as in claim 4, further comprising:

a balanced modulator having a carrier input connected to receive said second signal, an amplitude modulation input, and an output connected to said input of said second amplifier; and an amplitude modulation generator for generating and supplying an amplitude modulation signal to said balanced modulator amplitude modulation input to control the output from said balanced modulator such that the RF signal output from said second amplifier to said load impedance corresponds to the desired varying amplitude.

8. A circuit as in claim 4, in which said radio frequency signal generator comprises a phase-lock-loop frequency synthesizer.

9. A circuit as in claim 7, in which said amplitude modulation generator comprises a digital signal processor.

10. A circuit as in claim 9, in which said digital signal processor also produces an angle modulating signal.

11. A circuit as in claim 10, in which said angle modulating signal modulates a phase output of said radio frequency signal generator.

12. A circuit as in claim 10, in which said angle modulating signal modulates a frequency output of said radio frequency signal generator.

13. A circuit as in claim 10, in which said angle modulating signal and said amplitude modulating signal together define analog single sideband (SSB) modulation.

14. A circuit as in claim 10, in which said angle modulating signal and said amplitude modulating signal together define multi-level quadrature amplitude modulation.

15. A circuit as in claim 10, in which said angle modulating signal and said amplitude modulating signal together define QPSK linear multi-phase modulation.

16. A circuit as in claim 10, in which said angle modulating signal and said amplitude modulating signal together define OQPSK linear multi-phase modulation.

17. A circuit as in claim 10, in which said angle modulating signal and said amplitude modulating signal together define 8-PSK linear multi-phase modulation.

18. A circuit as in claim 1, further comprising a first quadrature modulator generating an input of the first amplifier and a second quadrature modulator generating an input of the second amplifier.

19. A circuit as in claim 18, in which the first and second quadrature modulates output 90° phase shifted signals.

20. A circuit for producing an amplified radio frequency (RF) signal having a desired varying voltage amplitude, comprising:

a first amplifier having an input and an output;

a load impedance;

a quarter wave network coupled between said first amplifier output and said load impedance;

a second amplifier having an input and an output coupled to said load impedance intermediate said load impedance and said quarter wave network, said first and second amplifiers being operable such that each contributes at said load impedance a fraction of a desired total power output from said circuit; and an amplifier driver circuit for generating an RF signal and for coupling the RF signal to said first and second amplifier inputs to drive said first and second amplifiers such that said first amplifier is operated in a saturated mode to produce a constant output signal amplitude that is coupled to said load impedance through said quarter wave network to develop an output signal across said load impedance due to said first amplifier, and such that said second amplifier is operated in a linear mode to produce an output signal of an amplitude varying in accordance with the amplitude of the RF signal, that is coupled to said load impedance to add to and subtract from the output signal amplitude at said load impedance due to said first amplifier, thereby to develop at said load impedance the amplified RF signal.

21. A circuit as in claim 20, wherein said quarter wave network comprises a quarter wave transmission line having an electrical length of one quarter the wavelength of the RF signal.

22. A circuit as in claim 20, wherein said amplifier driver circuit includes:
   a radio frequency (RF) signal generator for generating an RF signal having a desired angle modulation; and
   a 90° splitter for splitting the generated RF angle modulated signal into first and second phase modulated signals having a constant relative phase difference of 90°, said first signal being connected to said input to said first amplifier and said second signal being coupled to said input to said second amplifier.

23. A circuit as in claim 22, wherein said RF signal generator generates an RF signal having a desired frequency modulation.

24. A circuit as in claim 22, wherein said RF signal generator generates an RF signal having a desired phase modulation.

25. A circuit as in claim 22, wherein said amplifier driver circuit further includes:
   a balanced modulator having a carrier input connected to receive said second signal, an amplitude modulation input, and an output connected to said input of said second amplifier; and
   an amplitude modulation generator for supplying an amplitude modulation signal to said balanced modulator amplitude modulation input to control the output from said balanced modulator such that the RF signal output by said second amplifier to said load impedance corresponds to the desired varying amplitude.

26. A circuit as in claim 22, in which said RE signal generator comprises a phase-lock-loop frequency synthesizer.

27. A circuit as in claim 26, in which said amplitude modulation generator comprises a digital signal processor (DSP) producing an angle modulating signal.

28. A circuit as in claim 27, in which said angle modulating signal modulates the phase output of said radio frequency signal generator.

29. A circuit as in claim 27, in which said angle modulating signal modulates the frequency output of said radio frequency signal generator.

30. A circuit as in claim 28, in which said angle modulating signal and said amplitude modulating signal together define analog single sideband (SSB) modulation.

31. A circuit as in claim 28, in which said angle modulating signal and said amplitude modulating signal together define multi-level quadrature amplitude modulation including 16 QAM.

32. A circuit as in claim 28, in which said angle modulating signal and said amplitude modulating signal together define linear multi-phase modulation including linear QPSK.

33. A circuit as in claim 28, in which said angle modulating signal and said amplitude modulating signal together define linear multi-phase modulation including linear OQPSK.

34. A circuit as in claim 28, in which said angle modulating signal and said amplitude modulating signal together define linear multi-phase modulation including 8-PSK.

35. A circuit as in claim 20, further comprising a first quadrature modulator generating the input of the first amplifier and a second quadrature modulator generating the input of the second amplifier.

36. A circuit as in claim 35, in which the first and second quadrature modulates output 90° phase shifted signals.

37. An amplifier circuit, comprising:
   a first amplifier having an input and an output coupled to a load impedance through a quarter wave network;
   a second amplifier having an input and an output coupled to said load impedance intermediate said load impedance and said quarter wave network, said first and second amplifiers being operable such that each contributes at said load impedance a fraction of a desired total power output from said circuit; and
   an amplifier driver circuit for generating an RF signal having a desired angle modulation and for splitting the RF signal into first and second phase modulated signals having a constant relative phase difference of 90°, said amplifier driver circuit coupling said first signal to said input to said first amplifier and said second signal to said input to said second amplifier to drive said first and second amplifiers such that said first amplifier is operated in a saturated mode to produce a constant output signal amplitude that is coupled to said load impedance through said quarter wave network to develop an output signal across said load impedance due to said first amplifier, and such that said second amplifier is operated in a linear mode to produce an output signal of an amplitude in accordance with the amplitude of said second signal, that is coupled to said load impedance to add to and subtract from the output signal amplitude at said load impedance due to said first amplifier, thereby to develop at said load impedance the amplified RF signal.

38. An amplifier circuit as in claim 37, wherein said second signal coupled to said second amplifier is amplitude modulated by said amplifier driver circuit such that the amplified RF signal developed at said load impedance has a desired varying signal amplitude.

39. An amplifier circuit as in claim 37, wherein said amplifier driver circuit includes:
   a balanced modulator having a carrier input connected to receive said second signal, an amplitude modulation input, and an output connected to said input of said second amplifier; and
   an amplitude modulation generator for generating and supplying an amplitude modulation signal to said balanced modulator amplitude modulation input to control the output from said balanced modulator such that the RF signal output by said second amplifier to said load impedance corresponds to a desired varying amplitude.

40. An amplifier circuit as in claim 39, wherein said amplitude modulation generator generates and supplies a bipolar amplitude modulation signal to said amplitude modulation input to said balanced modulator that produces both positive and negative amplitudes of the signal at said input to said second amplifier.

41. An amplifier circuit as in claim 40, wherein the bipolar amplitude modulating signal causes the output signal from said second amplifier to be of an amplitude to either add to, in the case of positive amplitudes of the output signal, or subtract from, in the case of negative amplitudes of the output signal, the output signal amplitude at said load impedance due to the output signal from said first amplifier, thereby developing at said load impedance the amplified RF signal having the desired frequency and varying in amplitude between a minimum or "trough" amplitude and a maximum or "crest" amplitude.

42. An amplifier circuit as in claim 37, wherein said first signal developed by said amplifier driver circuit is of constant amplitude and said second signal is linearly related to the desired varying signal amplitude at said load impedance.

43. An amplifier circuit as in claim 37, wherein said constant relative phase difference of 90° between said first and second signals causes the outputs of said first and second amplifiers to be in phase at said load impedance.

44. An amplifier as in claim 36, wherein said amplifier driver circuit includes a digital signal processor (DSP) for generating said RF signal having said desired angle modulation and for generating said bipolar amplitude modulation signal.

45. An amplifier circuit as in claim 40, wherein said DSP generates said RF signal to have a desired phase modulation.

46. An amplifier circuit as in claim 40, wherein said DSP generates said RF signal to have a desired frequency modulation.

47. An amplifier circuit as in claim 33, wherein said amplifier driver circuit generates said RF signal to have a constant amplitude and a desired phase angle trajectory.

48. A method of producing am amplified radio frequency (RF) signal having a desired varying amplitude from the amplifier;
    coupling the output signal from the first amplifier through a quarter wave network to a load impedance;
    operating a second amplifier to generate a modulated signal amplitude output; and
    coupling the output signal fro the second amplifier to the load impedance such that the output from the second amplifier adds to and substracts from the signal amplitude at the load impedance due to the first amplifier to produce at the load impedance the amplified RF signal.

49. A method as in claim 44, wherein operating the second amplifier to generate a modulated signal amplitude output comprises providing to an input of the second amplifier a drive signal having a value in accordance with a desired value of the amplified RF signal.

50. A method as in claim 44, wherein coupling the output signal from the first amplifier through a quarter wave network to a load impedance comprises coupling the output signal from the first amplifier to the load impedance through a quarter wave transmission line having an electrical length of one quarter the wavelength of the RF signal.

51. A method as in claim 44, further comprising:
    generating an RF signal having a desired angle modulation; and
    splitting the generated RF signal into first and second phase modulated signals having a constant relative phase difference of 90°,
    wherein operating the first amplifier in a saturated mode to provide a constant output signal amplitude from the amplifier comprises coupling the first signal to an input to the first amplifier, and
    wherein operating the second amplifier to generate a modulated signal amplitude output comprises coupling the second signal to an input to the second amplifier.

52. A method as in claim 47, wherein generating an RF signal having a desired angle modulation comprises generating an RF signal having a desired frequency modulation.

53. A method as in claim 47, wherein generating an RF signal having a desired angle modulation comprises generating an RF signal having a desired phase modulation.

54. A method as in claim 47, further comprising:
    generating an amplitude modulation signal; and
    controlling the amplitude of the second signal at the input to the second amplifier in accordance with the value of the amplitude modulation signal, such that an RF signal output from the second amplifier corresponds to a desired varying amplitude.

55. A method as in claim 47, wherein generating an RF signal having a desired angle modulation comprises generating the RF signal with a phase-lock-loop synthesizer.

56. A method as in claim 50, wherein generating an amplitude modulation signal comprises generating an amplitude modulation signal with a digital signal processor (DSP).

57. A method as in claim 47, further comprising:
    generating an angle modulating signal; and
    controlling the RF signal in accordance with the angle modulating signal to have a desired angle modulation.

58. A method as in claim 53, wherein controlling the RF signal in accordance with the angle modulating signal to have the desired angle modulation comprises controlling the RF signal in accordance with the angle modulating signal to have a desired phase.

59. A method as in claim 53, wherein controlling the RF signal in accordance with the angle modulating signal to have the desired angle modulation comprises controlling the RF signal in accordance with the angle modulating signal to have a desired frequency.

60. A method as in claim 48, further comprising generating a first quadrature modulated signal as an input to the first amplifier and generating a second quadrature modulated signal as an input to the second amplifier.

61. A method as in claim 60 in which the first and second quadrature modulates output 90° phase shifted signals.

62. A method of amplifying a radio frequency (RF) signal, comprising:
    coupling an output from a first amplifier to a load impedance through a quarter wave network:
    coupling an output from a second amplifier to the load impedance intermediate the load impedance and the quarter wave network;
    generating an RF signal;
    splitting the RF signal into first and second phase modulated signals having a constant relative phase difference of 90°;
    coupling the first signal to the input to the first amplifier to operate the first amplifier in a saturated mode to produce a constant amplitude signal output that is coupled to the load impedance through the quarter wave network to develop a signal amplitude across the load impedance due to the first amplifier; and
    coupling the second signal to the input to the second amplifier to operate the second amplifier in a linear mode to produce from the second amplifier an output signal, of an amplitude in accordance with the amplitude of the second signal, that is coupled to the load impedance to add to and subtract from the amplitude of the signal at the load impedance due to the first amplifier, thereby to develop at the load impedance the amplified RF signal.

63. A method as in claim 62, wherein generating an RF signal comprises generating an RF signal having a desired angle modulation.

64. A method as in claim 62, further comprising amplitude modulating the second signal coupled to the second amplifier input such that the amplified RF signal developed at the load impedance has a desired varying signal amplitude.

65. A method as in claim 62, further comprising:
    generating an amplitude modulation signal; and
    controlling the amplitude of the second signal at the input to the second amplifier in accordance with the value of the amplitude modulation signal, such that an RF signal output from the second amplifier to the load impedance corresponds to a desired varying amplitude.

66. A method as in claim 62, further comprising:

generating a bipolar amplitude modulation signal; and controlling the amplitude of the second signal at the input to the second amplifier in accordance with the value of the bipolar amplitude modulation signal, such that the second signal has both positive and negative amplitudes at the input to the second amplifier.

67. A method as claimed in claim 66, wherein the bipolar amplitude modulation signal causes the output signal from the second amplifier to be of an amplitude to either add to, in the case of positive amplitudes of the output signal, and subtract from, in the case of negative amplitudes of the output signal, the signal amplitude across the load impedance due to the output signal from the first amplifier, thereby developing at the load impedance the amplified RF signal having the desired frequency and varying in amplitude between a minimum or "trough" amplitude and a maximum or "crest" amplitude.

68. A method as in claim 62, wherein generating an RF signal generates a constant amplitude RF signal.

69. A method as in claim 62, wherein generating an RF signal generates an RF signal having a desired phase modulation.

70. A method as in claim 62, wherein generating an RF signal generates an RF signal having a desired frequency modulation.

71. A method as in claim 62, wherein generating an RF signal generates an RF signal having a constant amplitude and a desired phase angle trajectory.

* * * * *

UNITED STATES PATENT AND TRADEMARK OFFICE
CERTIFICATE OF CORRECTION

Figure 3:
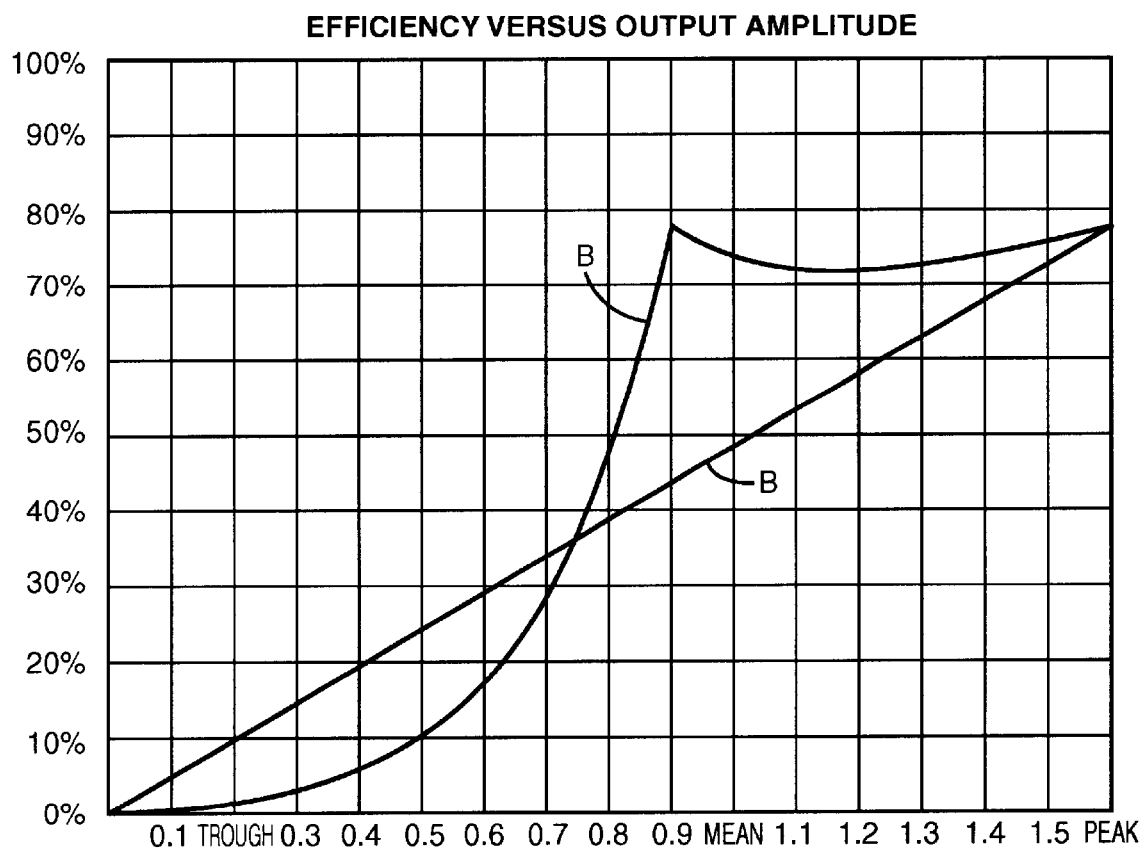
FIG. 3 graphically illustrates amplifier efficiency versus output for an amplifier constructed according to the present invention versus a conventional Class B amplifier.

PATENT NO. : 6,359,506 B1
DATED : March 19, 2002
INVENTOR(S) : William O. Camp, Jr. and Paul W. Dent It is certified that error appears in the above-identified patent and that said Letters Patent is hereby corrected as shown below:

Drawings,
Figure 2, add lead line (as shown on the attached page)
Figure 3, correct upper curve marked "B" to -- A -- (as shown on the attached page)

Signed and Sealed this

Tenth Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,359,506 B1
DATED : March 19, 2002
INVENTOR(S) : William O. Camp, Jr. and Paul W. Dent It is certified that error appears in the above-identified patent and that said Letters Patent is hereby corrected as shown below:

Column 11,
Line 5, "as in claim 36" should be -- as in claim 40 --
Lines 10 and 12, "as in claim 40" should be -- as in claim 44 --
Line 15, "as in claim 33" should be -- as in claim 37 --
Line 25, "fro" should be -- from --
Lines 30, 35 and 41, "as in claim 44" should be -- as in claim 48 --
Line 49, add "first" at beginning of line, should read
-- first amplifier comprises coupling --
Lines 54, 57 and 60, "as in claim 47" should be -- as in claim 51 --

Column 12,
Lines 1 and 8, "as in claim 47" should be -- as in claim 51 --
Line 4, "as in claim 50" should be -- as in claim 54 --
Lines 12 and 17, "as in claim 53" should be -- as in claim 57 --

Signed and Sealed this

Nineteenth Day of April, 2005

JON W. DUDAS
*Director of the United States Patent and Trademark Office*